United States Patent [19]

Nielson et al.

[11] Patent Number: 4,928,280
[45] Date of Patent: May 22, 1990

[54] FAST PROCESSOR FOR MULTI-BIT ERROR CORRECTION CODES

[75] Inventors: Marlin C. Nielson, Boulder; Kenneth R. Woodruff, Louisville, both of Colo.

[73] Assignee: International Business Machines Corporation, Armonk, N.Y.

[21] Appl. No.: 187,718

[22] Filed: Apr. 29, 1988

[51] Int. Cl.⁵ .............................................. G06F 11/10
[52] U.S. Cl. .................................. 371/39.1; 371/37.5
[58] Field of Search ..................... 371/37, 38, 39, 40, 371/39.1, 38.1, 37.5, 37.1

[56] References Cited
U.S. PATENT DOCUMENTS 4,450,561  5/1984  Gotze .................................... 371/37
4,577,237  3/1986  Collins ............................. 371/40 X
4,667,326  5/1987  Young ................................... 371/40
4,758,902  7/1988  Okamoto ......................... 371/38 X
4,763,332  8/1988  Glover ................................. 371/37

Primary Examiner—Allen MacDonald
Assistant Examiner—Robert W. Beausoliel
Attorney, Agent, or Firm—Carl M. Wright

[57] ABSTRACT

Apparatus and method for performing error checking and syndrome generation on multibit characters of blocks of messages. The characters are processed ad seriatim and the symbols or syndromes are accumulated until all characters of a block have been processed. The check symbols are concatenated with the associated message block while the check symbols are accumulated for the next block. If there is a nonzero syndrome, the accumulated syndromes can be extracted while the syndromes for a next block are being generated.

9 Claims, 4 Drawing Sheets

| SIG | GENERATE CHECK SYMBOL ||||||| OUTPUT CHECK SYMBOL BLOCK ||
| | INITIAL CYCLE ||| REMAINDER CYCLE ||| FINAL CYCLE | | |
| | 1 | 2 | 3 | 1 | 2 | 3 | 3 | ODD | EVEN |
|---|---|---|---|---|---|---|---|---|---|
| K1 | 0 | | | 0 | | | | | |
| K2 | 1 | 1 | 1 | 1 | 1 | 1 | 0 | | |
| K3 | 0 | 1 | 1 | 0 | 1 | 1 | 0 | | |
| K4 | 1 | 1 | 1 | 1 | 1 | 1 | 0 | | |
| K5 | 0 | 1 | 1 | 0 | 1 | 1 | 1 | | |
| K6 | | 0 | 0 | | 0 | 0 | 0 | | |
| K7 | | 1 | 1 | | 1 | 1 | 1 | | |
| K8 | 1 | 1✦ | 1✦ | 1✦ | 1✦ | 1✦ | 1✦ | | 0 |
| K9 | | 1✦✦ | 1✦✦ | 1✦✦ | 1✦✦ | 1✦✦ | 1✦✦ | 0 | |
| K10 | 0 | 0/1 | 0/1 | 0/1 | 0/1 | 0/1 | | | |
| K11 | | | | | | | | | |
| K12 | | | | | | | | | |
| ACC | L | G | G | L | G | G | G | | |
| ADR | G | G | G | G | G | G | G | | |
| CADR | | | | | | | | 1 | 1 |
| CK | | | | | | | | L | L |
| DATR | | | | | | | | | |
| DIN | G | L | L | G | L | L | | | |
| ICTR | | | | | | | | | |
| INIT | G | | | | | | | | |
| MEM1 | | R✦ | W✦ | R✦ | R✦ | W✦ | W✦ | | R |
| MEM2 | | R✦✦ | W✦✦ | R✦✦ | R✦✦ | W✦✦ | W✦✦ | R | |
| ROM | | R | | R | | | R | | |
| SSM | | | | | | | | | |
| WCTR | | G | | | G | | G | | |

FIG. 4

| SIG | BLOCK | | | | | | | | SYNDROME FETCH | |
|---|---|---|---|---|---|---|---|---|---|---|
| | ODD | | | | EVEN | | | | BLOCK | |
| | INIT CYCLE | | REM CYCLE | | INIT CYCLE | | REM CYCLE | | ODD | EVEN |
| | 1 | 2 | 1 | 2 | 1 | 2 | 1 | 2 | | |
| K1 | 1 | | 1 | | 1 | | 1 | | | |
| K2 | | 0 | | 0 | | 0 | | 0 | | |
| K3 | | 1 | | 1 | | 1 | | 1 | | |
| K4 | | 0 | | 0 | | 0 | | 0 | | |
| K5 | | 1 | | 1 | | 1 | | 1 | | |
| K6 | | 1 | | 1 | | 1 | | 1 | | |
| K7 | | 1 | | 0 | | 1 | | 0 | | |
| K8 | | 1 | 1 | 1 | | | | | | 0 |
| K9 | | | | | | 1 | 1 | 1 | 0 | |
| K10 | | | 0 | | | | 1 | | | |
| K11 | | | | | | | | | 0 | 0 |
| K12 | | | | | | | | | 1 | 1 |
| ACC | L | G | L | G | L | G | L | G | | |
| ADR | | G | G | G | | G | G | G | | |
| CADR | | | | | | | | | 1 | 1 |
| CK | | | | | | | | | | |
| DATR | | | L | G | | | L | G | | |
| DIN | G | L | G | L | G | L | G | L | | |
| ICTR | | | | | | | | | | |
| INIT | G | | | | G | | | | | |
| MEM1 | | W | R | W | | | | | | |
| MEM2 | | | | | | W | R | W | | |
| ROM | | R | | R | | R | | R | | |
| SSM | | U | | U | | U | | U | | |
| WCTR | | G | | G | | G | | G | | |

FIG. 5

FAST PROCESSOR FOR MULTI-BIT ERROR CORRECTION CODES

DOCUMENTS INCORPORATED BY REFERENCE

U.S. Pat. No. 4,142,174 having common assignee is hereby incorporated by reference.

BACKGROUND OF THE INVENTION

1. Field of the Invention

This invention relates to the encoding and decoding of error-correcting codes used for receiving or retrieving data subject to errors. In particular, the invention relates to cyclic codes for detecting and correcting burst errors. More particularly, the invention is a hardware system for processing interleaved Reed-Solomon code with programmable parameters. Apparatus is provided for performing check symbol generation with simultaneous check symbol output and syndrome generation with simultaneous syndrome fetch.

2. Description of Related Art

Numbers can be represented by vectors expressed as powers of X with coefficients representing data values, the coefficients being referred to herein as symbols. That is, X replaces the radix (base) of the power position series notation. If the symbols are represented by a single binary digit, 0 or 1, the symbols are called bits. A binary vector such as (1 0 0 1 0 1) is written as $X*5+X*2+1$ using vector notation. The expressed powers of X denote the power positions in the binary number representation having a value of one. (The * character represents exponentiation.)

A common class of error correction codes for bits are Hamming codes in which the symbols are comprised of several bits and only certain, selected combinations are used. The symbols' bits represent both parity and data. One example is a vector of eight bits, four parity and four data bits, arranged as follows:

PD P1 D1 P2 P3 D2 D3 D4 where P denotes a parity bit and D, a data bit. The PD parity bit is used to detect a double, uncorrectable parity error. If P1, P2, or P3 indicate a parity error but PD does not, then there is an uncorrectable error. Parity bit P1 is a parity check bit for the bits PD, P1, D1, and P2. Parity bit P2 is a parity bit check for bits PD, P1, P3, and D2. Parity bit P3 is a parity check bit for bits P1, P2, D2, and D4. As an example, assume bit D2 is incorrectly received. A parity error will be indicated by parity checks involving the bits PD, P2, and P3 whereas the parity check with P1 will indicate no error. There is no double error because the PD parity check indicates an error in addition to parity checks P2 and P3. Parity checks P1, P2, and P3 can be written 0 1 1 where 1 indicates a parity check error. Since bit is the third bit, i.e., bit D4 is the first bit, D3 is the second, and so on right to left, the 0 1 1 (binary 3) indicates that D2 is in error and can be inverted to its correct value.

As the number of bits increases, the parity checks according to the above example of a Hamming code become more complicated. In a system where bytes (eight bit data symbols) are transmitted in parallel, the system required for error checking becomes more complicated.

Error correcting block codes fall into three main subclasses. The first is linear block codes. For k bits per code word, $2*k$ separate, unique code words are possible. The set of all code words is called a code block. Each code word is encoded into a larger code word having more than k bits. The code words, also called code vectors, are selected so that the code block consists of code words more than a distance of one from any other code word in the code block. A distance of one means that any bit in the code word can change and the result will be another code word in the code block. Code words selected for a distance of two can err in one bit position and still be recognized as the intended word. A distance of two means that any bit can be wrong and the code word will not be another code word in the block.

Another subclass of block codes is called convolutional codes. Linear block codes depend only on the data being encoded whereas convolutional codes depend, in addition, on the preceding encoded blocks.

A third subclass is cyclic codes which have the advantage that they can be simply implemented with shift registers, exclusive-OR gates, and feedback connections. They are based on an underlying algebraic structure that makes analysis simple and aids the design of encoders and decoders. Cyclic codes can be used for corrections of random errors and burst errors. Cyclic codes are considered the most popular and the most useful.

A cyclic code that has proved very efficient is the BCH codes, named for their discoverers, Bose, Chaudhari, and Hocquenghem. The following explanation is supplied for background in the algebra upon which the BCH codes are based. One of the BCH codes is called the Reed-Solomon code.

Cyclic codes are produced by multiplying the symbols of the source data by a generator polynomial and dividing the received words by the same polynomial. A polynomial is a code vector. If the remainder after division is zero, the received words of the destination data contain no errors. If the remainder is not zero, then an error occurred and the remainder can be used in some cases to correct the errors. If the source data is sent without modification, then the product of the multiplication by the generator polynomial is appended to the end of the source data. These extra symbols are called check symbols. The remainder symbols resulting from division of the destination data by the generator polynomial are called syndromes. If the syndromes are zero-valued, then no error occurred between source and destination.

The codes are often identified as (n,k) codes where n denotes the number of symbols or code words in a block and k, the number of data symbols. The remaining n-k symbols are called parity symbols. A polynomial is a generator polynomial if it is a factor of $X*n+1$ and is of degree n−k. If n=7 and k=3, then $X*4+X*2+x+1$ is a generator polynomial of a (7,3) code.

A Galois field with $2*m$ symbols, denoted by GF($2*m$), can be used as symbols in a Reed-Solomon code. In general, there are two symbols (typically 0 and 1) and an m-degree polynomial, p(X). For m=4, p(X) is chosen so that all $2*m - 1$ symbols will be different. So, $$p(X) = X*4 + X + 1$$

and p(a)=0 so that $$p(a) = a*4 + a + 1$$

or $a*4 = a + 1.$

The field can therefore be represented by the following alphabet:

```
0
1
a
a*2
a*3
a*4  = a + 1
a*5  = a(a + 1) = a*2 + a
a*6  = a(a*2 + a) = a*3 + a*2
a*7  = a(a*3 + a*2) = a*3 + a + 1
a*8  = a*2 + 1
a*9  = a*3 + a
a*10 = a*2 + a + 1
a*11 = a*3 + a*2 + 1
a*12 = a*3 + a*2 + a + 1
a*13 = a*3 + a*2 + 1
a*14 = a*3 + 1
a*15 = 1
```

That is, each successive symbol is found by multiplying the previous symbol by a modulo-a*4, i.e., substituting $a+1$ for $a*4$.

If q is a power of a prime, e.g., 2, then an alphabet with q symbols can form a code. For positive integers g and h, there is a q-ary code of length $n=q*g-1$ which will correct any combination of at least h errors using a maximum of 2gh parity check bits. If $g=1$, then the code is called a Reed-Solomon code and the block length of the vector is $n=q-1$ and 2h parity bits are required. The minimum distance between correctable symbols is $2h+1$.

Let $q=1$ and $n=2*m-1$. The generator polynomial is $$g(X)=(X+a)(X+a*2)...(X+a*2h)$$

The transmitted or source vector will be represented by $$S(X)=s(0)+s(1)X+s(2)X*2+...+s(n-1)X*(n1)$$

and the received or destination vector by $$D(X)=d(0)+d(1)X+d(2)X*2+...+d(n-1)X*(n-1).$$

The error vector is the difference between the destination vector and the source vector, i.e., $$E(X) = D(X) - S(X)$$
$$= e(0) + e(1)X + e(2)X*2 + ... + e(n-1)X*(n-1).$$

If the number of errors is given by f not greater than h at positions denoted by $$E(X)=e(k-1)X*(k1)+e(k2)X*(k2)+...+e(kf)X*(kf),$$

then the error correction depends on determining the error locations ki and the error values e(ki).

As an illustrative example, let $h=3$ and $m=4$. The generator polynomial is $$g(X)=(X+a*2)(X+a*3)(X+a*4)(X+a*5)(X+a*6)$$

or $$g(X)=a*4+a*10 X+a*3X*2+a*9 X*3 +a*9 X*4+a*3X*5+X*6.$$

Let the source vector be all zeros and the destination vector be 0 0 0 a*7 0 0 a*3 0 0 0 0 0 a*4 0 0, so that $$D(X)=a*7X*3+a*3X*6+a*4X*12.$$

The syndrome components, S(i), for $i=1, 2, ..., 6$ are calculated by D(a*i), i.e., substituting a*i for X in D(X). Thus, $S(1)=a*12$, $S(2)=1$, $S(3)=a*14$, $S(4)=a*10$, $S(5)=0$, and $S(6)=a*12$. The value of S(1) was found as follows:

$$S(1) = D(a) = a*7\ a*3 + a*3\ a*6 + a*4\ a*12$$
$$= a*10 + a*9 + a*16$$

but a*16 is 1 and, using the above alphabet for $m=4$, $$S(1) = a*2 + a + 1 + a*3 + a + a$$
$$= a*3 + a*2 + a + 1$$
$$= a*12.$$

The other syndrome components are found in a similar manner using successive powers of a.

The syndromes indicate no errors if all are zero. If they are not all zero, then the syndromes can be used to correct the errors or bursts of errors. The error polynomial calculated from the above syndromes can be found to be $$E(X)=a*7 X*3+a*3 X*6+a*4X*12,$$

when subtracted from the destination vector leaves the all zero vector which was taken as the source vector. For more detailed information on the subject, see *An Introduction to Error-Correcting Code*, Shu Lin (Prentice-Hall 1970) and the references cited in U.S. Pat. No. 4,142,174 incorporated herein by reference.

As the number of symbols in the data alphabet increases, the more complicated and time-consuming becomes the coding and decoding processes. For example, for eight-bit bytes, i.e., GF(2*8), there are 256 symbols. Even with byte-wide parallel operations, the processes can be too slow to keep up with real time data retrieval. Some parallel processing schemes are shown in the following *IBM Technical Disclosure Bulletins*: "Cyclic Error Correction Code for Parallel Data Processing" by V. Rudolph, F. Schmidt, and W. Straehle (Vol. 21, No. 3) Aug. 1978, pp. 1087-1090; "Byte-Wide ECC/CRC Code and Syndrome Calculator" by M. C. Nielson and W. L. Wohler (Vol. 9, No. 5) Oct. 1986, pp. 2141-2145.

The invention is directed to processing the source data and the destination data at a speed that does not degrade the performance of the system in which it is incorporated. The apparatus is suitable for inclusion in an integrated circuit that can be included in a microprocessor system. The apparatus incorporates the byte-wide Galois field arithmetic processes but leaves the processing of the syndromes to correct any errors to the processor which controls the apparatus of the invention.

SUMMARY OF THE INVENTION

In accordance with the invention, check symbols are generated for message blocks having multibit characters by receiving each successive character in the block and processing the successive characters to accumulate the check symbols until all the characters of a block have been processed. The check symbols are then concatenated with the block while the check symbols of the next block are being generated. Similarly, the syndromes are generated by processing received characters, including the check symbols, by accumulating the partial syndromes from each successive received character. If a syndrome has a nonzero value, then the syndromes from one block can be extracted from the system while generating the syndromes from a next block.

BRIEF DESCRIPTION OF THE DRAWING

The invention is described in detail by referring to the various figures which illustrate specific embodiments of the invention, and wherein like numerals refer to like elements.

FIG. 3 is a table which illustrates an interleaving arrangement of message bytes and check symbols.

FIG. 4 is a table that describes the sequence of operation of the system in FIG. 2 during check symbol generation and check symbol output.

FIG. 5 is a table that describes the sequence of operation of the system in FIG. 2 during syndrome generation and syndrome output.

DESCRIPTION OF THE PREFERRED EMBODIMENT

Figure 1:
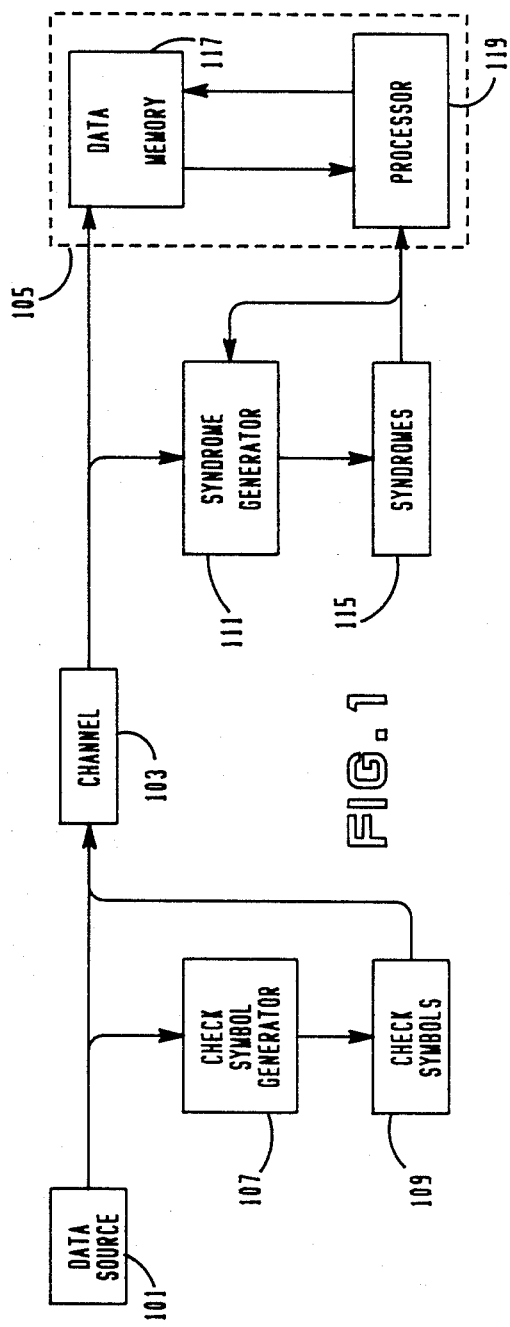
FIG. 1 is a block diagram of a system in which the invention is useful.

In the following description, the bus lines in the drawings represent eight conductors unless otherwise labelled. The multiplexers (MUX) have two or four inputs and one or two control inputs, respectively. For the two-input multiplexers, the A-input signals are gated to the output lines if the control signal (Kn) is binary zero and the B-input signals are gated to the output lines if the control signal is binary one. In the case of the four-input multiplexers, the A-input signals are gated to the output lines if both control signals (Kn and Kn+1) are binary zero; the B-input signals, if the control signals are binary zero and binary one, respectively; the C-input signals, if the control signals are binary one and binary zero, respectively; and the D-input signals, if the control signals are both binary one. The registers and memories have control signals which are not shown for purposes of clarity.

In FIG. 1, a block diagram illustrates the major parts of a system in which the invention can be used. A data source 101 transmits data via a channel 103 to a data memory 117 of a receiving device 105 which is illustrated as comprising a computer system with the data memory 117 and a central processor 119. The data from the channel 103 can be stored in the data memory 117 of the computer system 105 via a Direct Memory Access (DMA) means which does not require the intervention of the central processor 119. DMA systems are well known in the art and require no further explanation for an understanding of the present invention.

The channel 103 is represented by a block in FIG. 1 but is in reality a distributed collection of parameters that affect the signals in the path between the source and destination. The major parameters of interest are noise, signal-to-noise ratio, and bandwidth. The parameters cause distortion of the data being transmitted from the data source 101 so that the data received in the data memory 117 is not necessarily the same data that was transmitted. The difference between the transmitted data and the received data is the error introduced by the channel. The data vectors and the error vector change with time. The channel 103 also represents the characteristics governing the behavior of a recording system when recording and retrieving data. The word channel means any process to which data signals are subjected that is likely to distort or to change the data values. On the source side, a check symbol generator 107 receives each message byte sent over the channel 103 via an SB Data bus and calculates a set of check symbols intermediately stored in a storage 109 while the message bytes are being transmitted. After all the message bytes of a block have been sent, the resulting check symbols are concatenated with the message bytes and sent over the channel. Message block sizes are limited so several blocks are usually sent ad seriatim. For each block transmitted from the source, a separate set of check symbols is generated. At the destination side of the channel, the message bytes and check symbols are processed as received over the SB Data bus by a syndrome generator 111. The syndromes are intermediately stored in a storage device 115 while the bytes and check symbols are being received at the destination. Syndrome generation is an inverse process of check symbol generation. When a block has been received, a syndrome summary is immediately available to the central processor 119 indicating whether all the syndromes are zero. If the syndromes are all zero, the received bytes are correct. If any syndrome is not zero, at least one error occurred. To correct the error—or to determine that the error cannot be corrected—the syndromes are downloaded to the central processor 119 via a CP Bus where the calculations are made to ascertain the locations and corrections of the errors. As will be pointed out in the detailed explanation below, the syndrome fetch by the central processor 119 can be performed simultaneously with the generation of the syndromes for the next data block.

Since errors tend to occur in bursts or groups, channel characteristics may create a number of errors exceeding the correctional capability of the code structures. In data transmissions, for example, channel noise such as created by lightning may span and distort the transmission of several bytes. On storage media, defects may create many errors in a cluster. To reduce the effects of localized error causes, the check symbols are interleaved with the data message bytes so each check symbol covers nonsuccessive bytes. If each check symbol (or set of symbols) covers every i-th byte, then the block has i check symbols (or sets) and i is called the interleaf factor.

FIG. 3 illustrates the interleaving of the bytes in a message or byte stream with the check symbols. The interleaf factor in the example of FIG. 3 is eight. For each interleaf, there are four check symbols, four being the width factor of the block. The byte stream in FIG. 3 contains n bytes, 0 to n−1. The first set of check symbols, R00, R10, R20, and R30, are used in conjunction with Bytes 0, 8, 16, 24, ..., 8i, ..., and n−8. The second set of check symbols are associated with the Bytes 1, 9, ..., 8i+1, ..., and n−7. The interleaf and width factors can be selected and preset in the invention.

As will be clear from the following detailed explanation, the check symbol generator 107 with the check symbol storage 109 is the same apparatus as the syndrome generator 111 and the syndrome storage 115. That is, the apparatus according to the invention is used on both the source side and the destination side. The sequence of operation differs for check symbol generation (encoding) from that of syndrome generation (decoding) but the apparatus is similar.

Figure 2:
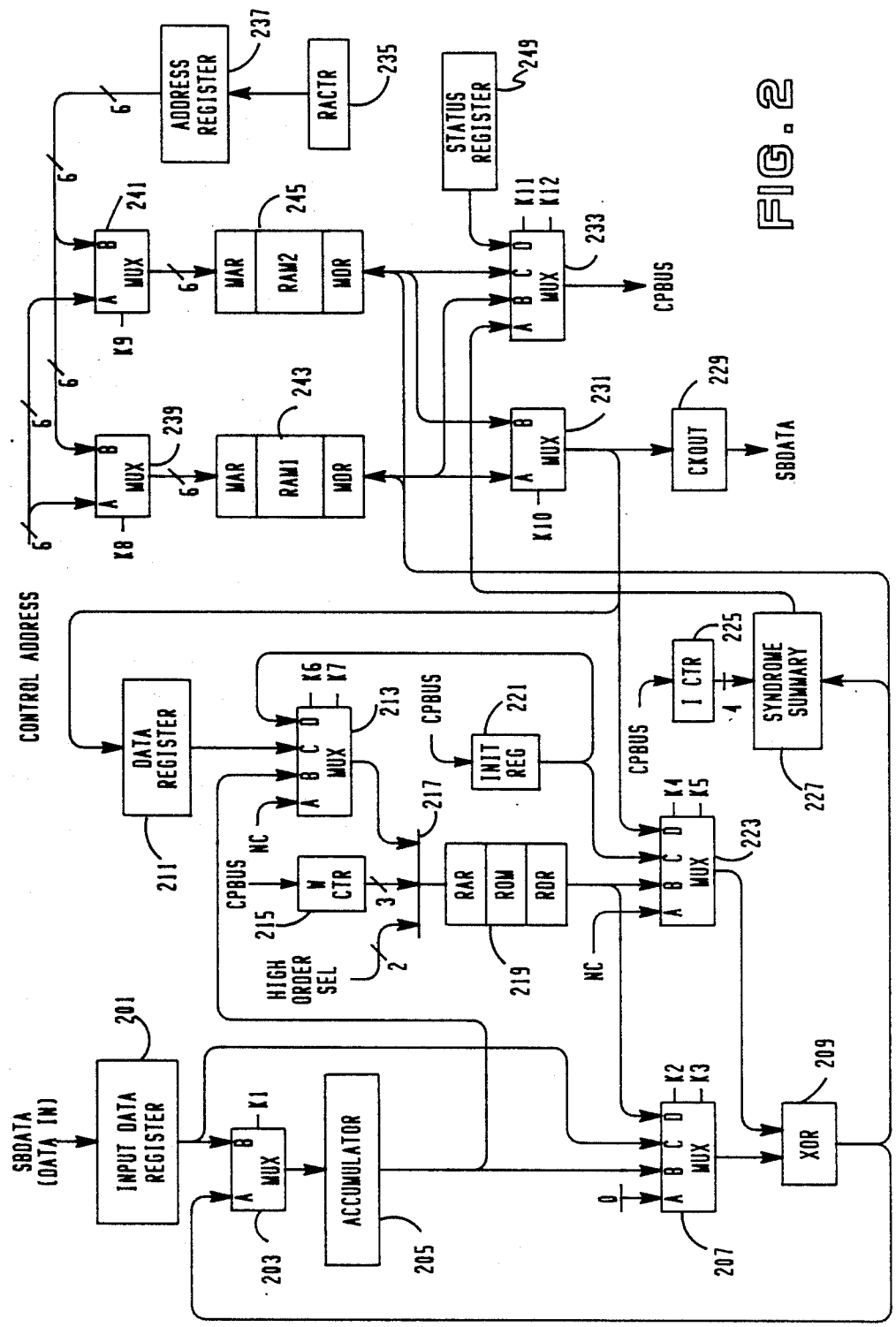
FIG. 2 is a block diagram of a preferred embodiment of the invention.

A preferred embodiment of the invention is illustrated in FIG. 2. The lines coupling the logic devices represent eight-conductor buses unless otherwise labelled or noted. The control signals, K1 through K12, which control the multiplexers and the load and gate control signals to the registers, not shown, are supplied from a controller such as a properly programmed microprocessor or a sequential machine. The controller is not shown but its operation will be described sufficiently to enable a person of ordinary skill to construct such a controller.

An input data register 201 stores successive bytes comprising the message byte stream. A multiplexer 203, controlled by a K1 signal, couples the output signals from the input data register 201 to an accumulator 205 when the value of the K1 signal is a logical one. When K1 is a logical zero, the output signals from eight Exclusive-OR (XOR) gates 209 are coupled to the accumulator 205.

The output signals from the accumulator 205 are coupled to two four-input multiplexers 207 and 213. When the K2 and K3 signals are logical zero and logical one, respectively, the output signals from the accumulator 205 are coupled to one set of input terminals to the XOR gates 209. When the K6 and K7 signals are a logical zero and logical one, respectively, the output signals from the accumulator 205 are coupled to some of the input terminals of the address register (RAR) of a Read-Only Memory 219 through combination gates 217. Parts of the ROM address are supplied by a W counter (W CTR) which contains the width, i.e., programmed number of check symbols and by two high order selection bits.

The calculations of check symbols and syndromes, the check symbols being on the encoding side and the syndromes on the decoding side, are performed using Galois arithmetic. The addition and multiplication operations are modulo-2*m—in the case of bytes, modulo-255. That is, the sum or products, if greater than 255, are the remainders if divided by 255. The single bit addition was represented by AND and multiplication, by exclusive-OR. The functions of Galois addition is performed by the exclusive-OR logic operation but multiplication is more complicated. The invention uses the Read-Only Memory (ROM) 219 to perform the multiplication operation. The input address to the ROM 219 is the byte to be multiplied and the five bits supplied by the W counter 215 and the high order select bits. The data at that location is the Galois eight-bit product of the input byte and the function byte which is used in the feedback path of shift register implementations.

FIGS. 4 and 5 are tables showing the sequence of operations for the apparatus shown in FIG. 2. FIG. 4 is the operation sequence for the encoding phase on the source side and FIG. 5 is the operation sequence for syndrome calculation and syndrome fetch on the destination side. The rows correspond to the multiplexer signals (Kn), 1 representing a logical one signal, and 0, a logical zero, for controlling the gating of the input signals to the multiplexers. Other rows are the signals to the registers in FIG. 2 as follows.

ACC Accumulator 205
ADR Address Register 237
CADR Control Address
CK CKOUT 229
DATR Data Register 211
DIN Input Data Register 201
ICTR I Counter 225
INIT Initialization Register 221
MEM1 Random Access Memory 1 243
MEM2 Random Access Memory 2 245
ROM Read-Only Memory 219
SSM Syndrome Summary Register 227
WCTR Width Counter 215.

The signals applied the registers are L and G, L indicating the register is loaded from its input terminals and G, that the register contents are gated to its output terminals. The letter U for the syndrome summary indicates the contents are updated. For memories, R indicates the contents of the memory are read from the addressed location and W indicates that the input data is written into the addressed location. For the control address, a 1 indicates that the address is active as supplied from the central processor. No entry in the table indicates no signal or a "don't care" signal.

The gate and load signal terminals on the registers are not shown for purposes of clarity. The control signals can be supplied from the central processor or from a separate controller such as a sequential machine. The construction of the controller is within the skill of the art given the operation sequence tables of FIGS. 4 and 5.

The first operation required is to encode the data to be transmitted or stored. The following is the sequence of operations of the circuit of FIG. 2 to perform the encoding operation. The steps are summarized in FIG. 4. The encoding operation takes place over a block of information as shown in FIG. 3. There are N bytes in the data message and 32 bytes in the check symbols in the illustrated block. The width is programmable in the system of FIG. 2, which performs the functions indicated by blocks 107 and 109 in FIG. 1, and is set to four in the illustrative example.

Each set of four check symbols is associated with the column of message bytes above it in FIG. 3. The check symbol bytes R00, R10, R20, and R30 are associated with and calculated using message bytes 0, 8, 16, ..., and N−8. The interleaf factor is the number of sets of check symbols. The interleaf factor is also programmable.

Another programmable feature of the invention is the initial character or byte. Although it can be any one of the possible 256 eight-bit bytes, it is usually chosen as all zeros or all ones. The only requirement for the initial character is that it be the same at both the destination side and source side so that the syndromes can be correctly calculated.

The check symbols RX0, for X=0, 1, 2, 3, depend on the initial character and the above-mentioned message bytes, 0, 8, 16, .., and N−8.

Check symbol generation is performed in three cycles. The initial sequence (first three columns in FIG. 4) processes the first interleaf, i.e., the first row of bytes shown in FIG. 3. Those bytes are processed using the initial character preset into the initialization register 221

(FIG. 2) and the remainder of the message bytes are processed using the partial results stored in the memories 243 and 245.

After the N message bytes of the first block are processed, the check symbols can be read out via the CKOUT register 229 to be concatenated with the message bytes while the next block is being processed. Thereafter, the odd and even blocks' message bytes can be processed while the check symbols of the previous block are sent to the destination. This is accomplished by alternating the use of the memories 243 and 245 as explained below in more detail.

In the table of FIG. 4, the signals for K8, K9, MEM1, and MEM2 are marked with asterisks. A single asterisk indicates the signals are used only for odd number blocks and double asterisks indicate the signals are used only for even number blocks. The signals for K10 are separated by a virgule, the left side signals being used for odd number blocks and the right side signals, for even number blocks. For all but cycle 1 of the initial interleaf, the signal to K10 is a logical zero for odd number blocks and a logical one for even number blocks.

The first cycle of the initial interleaf assumes that the input data register 201 has been loaded with the first message byte (byte 0 of FIG. 3). The contents of the data input register 201 are gated and passed by the multiplexer 207 to one set of input terminals to the XOR gates 209. The contents of the initialization register 221 are gated to the multiplexer 223 and coupled to the other input terminals of the XOR gates 209. The output signals from the XOR gates 209 are loaded into the accumulator 205 via the multiplexer 203. This corresponds to the exclusive-ORing of the most significant register contents and the input byte in the well known shift register version of a check symbol generator. The initial character (byte) in such versions is contained in the most significant register.

The next two cycles represent the exclusive-ORing of the feedback results of the previous operation times a Galois function fn(.) and the contents of successively less significant shift register stages.

During the second or third cycle, the input data register 201 can be loaded with the next message byte. The contents of the accumulator 205 are used to address the ROM 219 via the multiplexer 213 together with the contents of the width counter 215. The addressed ROM contents, representing the Galois product of the previous result times fn(.) are gated to one set of input terminals to the XOR gates 209 via the multiplexer 207 and the initial character from INIT REG 221 is gated to the other input of the XOR gates 209 via the multiplexor 223. In the third cycle, the signals from the XOR gates 209 are stored in the memory 243. (For even number blocks, the memory 245 is used to store the intermediate partial results.)

After the first interleaf has been processed, the sequence of operations is the same except the corresponding previous results from the memory 243 (or 245) are used in place of the contents of the initialization register 221, being gated via the multiplexer 231 and the multiplexer 223 to the XOR gates 209.

For the last message byte, corresponding to the least significant shift register of a shift register implementation, there is no previous shift register stage so the Galois product of the feedback signal and the fm(.) multiplier function are exclusively-ORed with zero signals supplied from the multiplexer 207 instead of previous results from the memory 243 (or 245).

After the message bytes of the first block have been processed, the final check symbols are stored in the memory 243. During the third cycle of the processing of the next block, the check symbols can be retrieved from the memory 243, using the control address from the controller or using the address register 237. The check symbols are read out in sequence, viz., R00, R01, and so on, and loaded into the CKOUT register 229 via the multiplexer 231. From the CKOUT register 229, the check symbols are transmitted via the SBDATA bus. After the message bytes of the even number blocks have been processed, the check symbols are read from the memory 245 and loaded in the CKOUT register via the multiplexer 231.

At the receiving or destination terminal, the bytes as received are used to generate the syndromes. The calculations of syndromes are done by blocks. While the syndromes are being calculated for one block, the non-zero syndromes for the previous block can be retrieved by the central processor to perform the error correction steps. Therefore, the syndrome operation is described for even and odd numbered blocks of information. The byte stream shown in FIG. 3 is a block as described above in the explanation of the encoding operation.

The destination phase of syndrome calculation is explained in detail below and shown in FIG. 5. The operations are specified in the columns of FIG. 5 and are divided into even and odd blocks as explained below. The blocks are divided into two sets of cycles, INIT for the initial bytes in the first interleaf, i.e., the top row of the block shown in FIG. 3. The initial calculations are performed using the contents of the initialization register (INIT 221) which is initialized at the beginning of the operation with the same character as that with which the check symbol generation was initialized. The remaining interleaves, i.e., the second and subsequent rows of data in FIG. 3, indicated by REM in the table of FIG. 5, are calculated using the partial results from the initial calculations which are stored in the memories, RAM1 and RAM2.

The memories RAM1 and RAM2 are used alternately so that, if the syndromes of a previous block are not zero, indicating an error, the central processor can retrieve the syndromes from one memory while the syndromes are being calculated for the next block.

The syndromes are generated in two cycles per byte as the bytes are received or retrieved. For the first I bytes, eight in the illustrative example, the input data register 201 receives the present byte which is stored in the accumulator 205 via the multiplexer 203 using the signals shown in FIG. 5, viz., K1 is 1 and LACC is active.

In the second cycle, the contents of the accumulator 205 are gated to the XOR gates 209 via the multiplexer 207 and the initial character is gated from its register 221 through the multiplexer 213 to form part of the RAR contents of the ROM 219. The data from the ROM Data Register (RDR), the product of the multiplier function and the initial character, is gated to the XOR gates 209 via the multiplexer 223. The resulting Galois sum is stored in RAM1 243 and a nonzero result is flagged in the syndrome summary register 227. (For even-numbered blocks, the sum is stored in RAM2 245.)

The first and second cycles are performed for the first I bytes. After the first I bytes, the initial byte is no longer used. The input bytes to the RAR are the partial results stored in RAM1 243 (or RAM2 245), which is addressed by the contents of the address register 237 which is set and updated by the RACTR 235 (Random Address Counter). The address is coupled to the RAM1 243 via the multiplexer 239 to the memory address register (MAR). The data from the memory data register (MDR) is set into the data register 211 via the multiplexer 231. The contents of the data register 211 are used to address the ROM 219 via the multiplexer 213. The output data from the ROM 219 is the product of the sums of previous products (for the particular interleaf) and the associated generator function.

After the N−8 byte has been processed, the RX0 syndrome has been calculated. After the N−1 byte has been processed, all the syndromes have been calculated. The syndrome summary register 227 contains information whether the syndromes are all zero or not. Via the multiplexer 233, the central processor can access the syndrome summary to determine whether there is an error in the destination (received) data. If the syndromes are all zeros, then the message bytes, which were concurrently stored in the central processor's memory, are correct. If the syndromes are not all zero, then one or more errors have occurred in the retrieval. The central processor uses the syndromes, stored in RAM1 243, to determine the errors and their locations using the methods well known in the art.

The syndromes can be retrieved from the RAM1 243 as the next block's syndromes are being calculated and stored in RAM2 245 during processing of the even numbered blocks. The functions of the memories RAM1 and RAM2 are alternated for odd and even blocks. While odd blocks (other than the first block) are being processed, the syndromes from RAM2 245 are being retrieved by the central processor using the control address (supplied by the central processor) to address RAM2 245 via the multiplexer 241. The syndromes are coupled to the central processor bus via the multiplexer 233. While even blocks are being processed, the syndromes from the previous odd block are retrieved, if needed, by the central processor by coupling the control address to the MAR via the multiplexer 239.

The arrangement of the hardware in FIG. 2 allows simultaneity in calculating and retrieving syndromes. This speeds up the functions considerably and improves the performance of the circuit as a coprocessor.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. Apparatus for generating check symbols for error correctable encoding of blocks of messages composed of serial, multibit characters comprising:
   means for receiving each successive character of a message;
   means for processing successive input characters with partial check symbols generated from preceding received characters to form new partial check symbols;
   means for accumulating partial check symbols until all message characters have been processed;
   means for outputting accumulated check symbols to be concatenated with the block of said message characters while a next block of message characters is processed by the receiving, processing, and accumulating means;
   means for selectively initializing said partial check symbols;
   means for selecting the number of check symbols to be generated for each block of messages;
   means for interleaving said message characters into sets; and
   means for partitioning said check symbols whereby each said partition is associated with a different set of interleaved characters.

2. The apparatus as claimed in claim 1 including: means for selecting the number of interleaved sets.

3. The apparatus as claimed in claim 2 including: means for selecting the number of check symbols in each partition.

4. The apparatus as claimed in claim 1 wherein said processing means includes:
   means for multiplying successive partial check symbols by predetermined functions to produce error-correctable characteristics in said partial check symbols.

5. The apparatus as claimed in claim 4 wherein said multiplying means includes:
   preset memory means having addressing means and data output means;
   means for supplying an address to said addressing means depending on said partial check symbols; and
   means for applying the contents of the memory means as the product of a function times the partial check symbol to said data output means.

6. A method of generating check symbols for error correctable encoding of blocks of messages composed of serial, multibit characters comprising the steps of:
   receiving each successive character of the message;
   processing successive input characters with partial check symbols generated from preceding received characters to form new partial check symbols;
   accumulating partial check symbols until all message characters have been processed;
   outputting accumulated check symbols to be concatenated with the block of said message characters while a next block of message characters is processed by the receiving, processing, and accumulating steps;
   selectively initializing said partial check symbols;
   selecting the number of check symbols to be generated for each block of messages;
   interleaving said message characters into sets; and
   partitioning said check symbols whereby each said partition is associated with a different set of interleaved characters.

7. The method claimed in claim 6 including the step of:
   selecting the number of interleaved sets.

8. The method claimed in claim 6 including the step of:
   means for selecting the number of check symbols in each partition.

9. The method claimed in claim 6 wherein said processing step includes the step of:
   multiplying successive partial check symbols by predetermined functions to produce error-correctable characteristics in said partial check symbols.

* * * * *